(12) United States Patent
Fitzgerald et al.

(10) Patent No.: US 7,239,517 B2
(45) Date of Patent: Jul. 3, 2007

(54) INTEGRATED HEAT SPREADER AND METHOD FOR USING

(75) Inventors: Thomas J. Fitzgerald, Phoeniz, AZ (US); Mukul P. Renavikar, Chandler, AZ (US); Susheel G. Jadhav, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 289 days.

(21) Appl. No.: 11/105,061

(22) Filed: Apr. 11, 2005

(65) Prior Publication Data

US 2006/0227510 A1 Oct. 12, 2006

(51) Int. Cl.
*H05K 7/20* (2006.01)

(52) U.S. Cl. .................. 361/704; 361/707; 361/719; 257/706; 257/712

(58) Field of Classification Search .................. None
See application file for complete search history.

(56) References Cited

U.S. PATENT DOCUMENTS

| | | | | |
|---|---|---|---|---|
| 4,561,011 A | * | 12/1985 | Kohara et al. ............. 257/713 |
| 5,396,403 A | * | 3/1995 | Patel ............................ 361/705 |
| 5,410,449 A | * | 4/1995 | Brunner ....................... 361/719 |
| 5,587,882 A | * | 12/1996 | Patel ............................ 361/705 |
| 5,821,161 A | * | 10/1998 | Covell et al. ................ 438/613 |
| 5,926,371 A | * | 7/1999 | Dolbear ....................... 361/704 |
| 6,281,573 B1 | * | 8/2001 | Atwood et al. ............. 257/706 |
| 6,292,369 B1 | * | 9/2001 | Daves et al. ................. 361/719 |
| 6,362,435 B1 | | 3/2002 | Downey et al. |
| 6,656,770 B2 | * | 12/2003 | Atwood et al. ............. 438/118 |
| 6,724,078 B1 | * | 4/2004 | Sur et al. ..................... 257/704 |
| 6,822,331 B2 | | 11/2004 | Eytcheson |
| 6,903,271 B2 | * | 6/2005 | Pearson et al. ............. 174/548 |
| 7,119,432 B2 | * | 10/2006 | Desai et al. ................. 257/706 |
| 2004/0190263 A1 | | 9/2004 | Jadhav et al. |

* cited by examiner

*Primary Examiner*—Boris Chervinsky
(74) *Attorney, Agent, or Firm*—Schwabe, Williamson & Wyatt, P.C.

(57) ABSTRACT

Integrated heat spreader and die coupled with solder. The heat spreader may have solder reservoirs. Additionally, the heat spreader and die may be coupled during a reflow process where the gaseous pressure surrounding the integrated heat spreader and the die is varied.

7 Claims, 6 Drawing Sheets

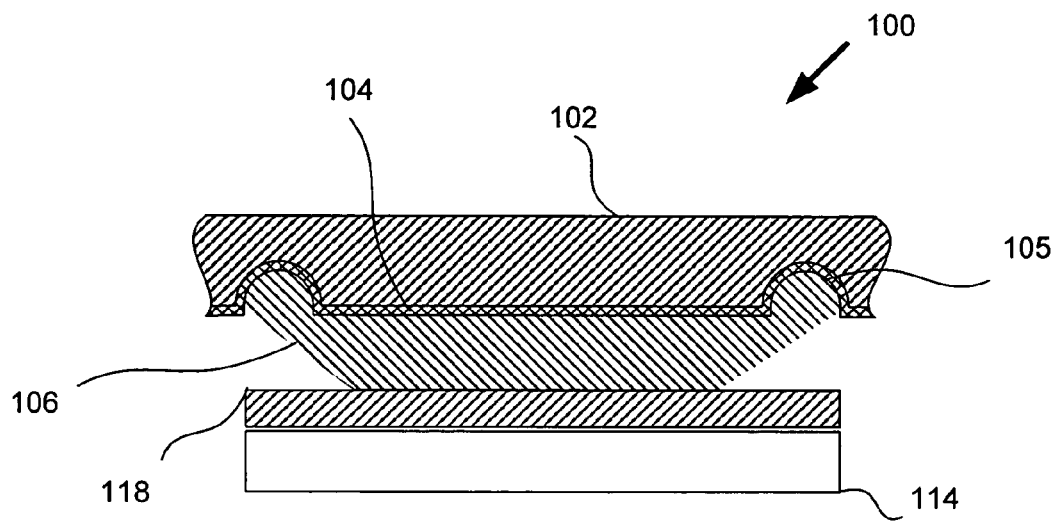
*Fig. 1a*
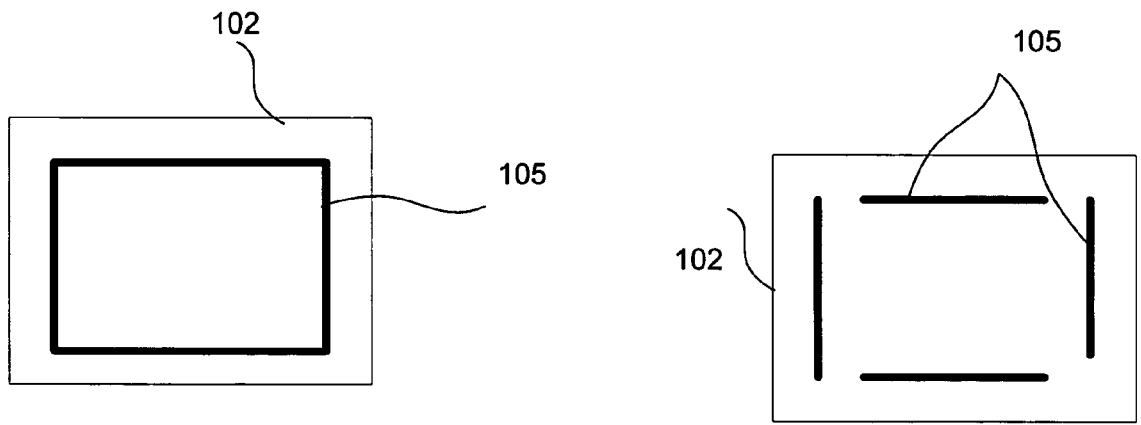
*Fig. 1b*
*Fig. 1c*
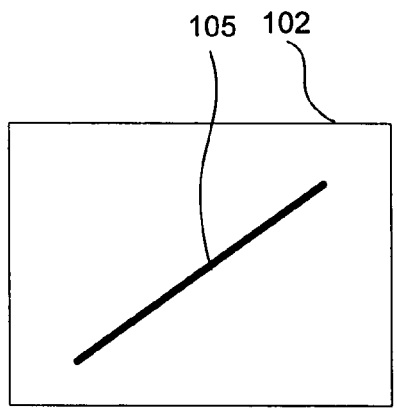
*Fig. 1d*

INTEGRATED HEAT SPREADER AND METHOD FOR USING

TECHNICAL FIELD

Embodiments of the present invention relate to, but are not limited to, the field of electronic devices and, in particular, to the field of electronics packaging. More specifically, embodiments of the present invention relate to bonding integrated heat spreaders to a die with a solderable thermal interface.

BACKGROUND

The current trend in electronics is to make electronic devices with smaller components operating at higher clock frequencies and power levels generating more and more heat. These components include electronic packages such as microprocessor and memory packages. The electronic packages typically include a die that is usually mounted onto a supporting substrate sometimes referred to as a carrier or package substrate ("substrate"). The electronic package, in turn, is typically physically and electrically coupled to a printed circuit board (PCB). The die and the substrate are typically made of multiple ceramic or silicon layers. The heat generated by such electronic packages can increase to high levels. One common approach to draw the heat away from the die includes the use of an Integrated Heat Spreader (IHS) as a lid in thermal contact with the die. To ensure thermal coupling between the IHS and the die a Thermal Interface Material (TIM) is used. The TIM can comprise a variety of materials including solderable materials.

BRIEF DESCRIPTION OF DRAWINGS

The present invention will be described by way of exemplary embodiments, but not limitations, illustrated in the accompanying drawings in which like references denote similar elements, and in which:

FIG. 1a illustrates a cross-sectional representation of a solderable thermal interface between a die and an integrated heat spreader, in accordance with one embodiment of the invention;

FIG. 1b-1d illustrate plan views of a die side of an integrated heat spreader, in accordance with one embodiment of the invention;

DETAILED DESCRIPTION OF ILLUSTRATIVE EMBODIMENTS

Figure 2:
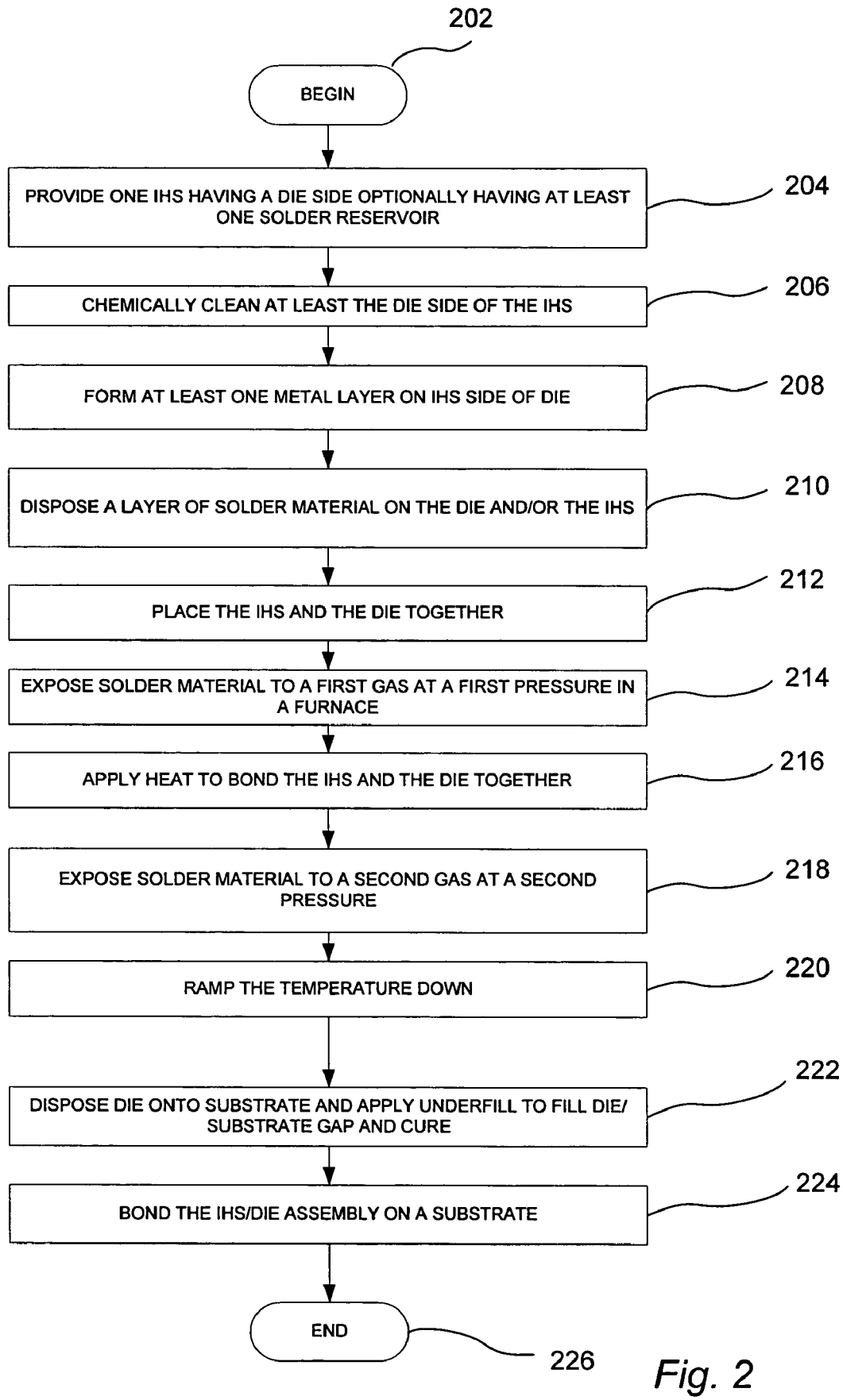
FIG. 2 illustrates a flow diagram of a method of packaging a die with a heat spreader, in accordance with one embodiment of the invention.

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention.

The following description may include terms such as on, onto, on top, underneath, underlying, downward, lateral, and the like, that are used for descriptive purposes only and are not to be construed as limiting. That is, these terms are terms that are relative only to a point of reference and are not meant to be interpreted as limitations but are instead included in the following description to facilitate understanding of the various aspects of the invention.

The phrase "in one embodiment" is used repeatedly. The phrase generally does not refer to the same embodiment; however, it may.

The terms "comprising", "having" and "including" are synonymous, unless the context dictates otherwise.

The terms "Integrated Heat Spreader", "IHS", "lid", "IHS lid", "Integrate Thermal Spreader", and "Integrated Heat Sink" are synonymous, unless the context dictates otherwise.

Further, various operations will be described as multiple discrete operations, in turn, in a manner that is most helpful in understanding the present invention; however, the order of description should not be construed as to imply that these operations are necessarily order dependent. In particular, these operations need not be performed in the order of presentation. In addition, one or more of the operations may be eliminated while other operations may be added in different embodiments of the invention.

FIG. 1a illustrates a cross sectional representation of a portion of a die 114 and an integrated heat spreader 102 according to one embodiment. The integrated heat spreader 102 is attached to the back surface of the die 114 using a suitably solderable thermal interface material 106. For improved solderability of the thermal interface material 106 to the die 114, one or more metal layers 118 may be deposited on a first side of the die (the IHS side) that is to be coupled via thermal interface material 106 to the IHS 102 by any number of suitable methods.

In one embodiment, the die side 104 of the IHS 102 may comprise any suitably solder wettable material (e.g., copper (Cu), gold (Au), and nickel (Ni)).

For various embodiments, any number of solder materials may be used as is, or in combination with one another, to form the TIM 106. Some of these materials comprise bismuth (Bi), tin (Sn), indium (In), silver (Ag), lead (Pb), gold (Ag), and/or copper (cu).

In various embodiments, for improved solderability of the thermal interface material 106 to the die side 104 of the IHS 102, the die side 104 may be chemically cleaned by any suitable chemical process.

In some embodiments, The thermal interface material 106 can be deposited on either the die side 104 of the IHS 102 or on the metallic layer 118 of the die 114 by any number of suitable processes, for example sputtering, vapor deposition, electro-plating, electroless plating or other known deposition methods. The solderable TIM 106 may also be initially disposed in a foil form. In an embodiment, the foil film can be approximately 100-200 um thick and conforms to a topography of the metallic layer side of the die 114.

In accordance with an embodiment, the die side 104 of the IHS 102 may have one or more solder reservoirs 105. These reservoirs 105 may be in the form of a recession or depression in the IHS. They act to store additional solder 106 that may be used in a reflow process to provide additional solderable material. This may assist in reducing the number voids and the size of the voids that can form because of trapped air or the production of volatiles from flux.

FIGS. 1b-1c illustrate examples of reservoirs 105 on the IHS 102. These reservoirs 105 may be fabricated in any number of suitable methods including but not limited to stamping, milling, machining, and such. The geometry, number of reservoirs, deposition, and assembly can all be varied by one of ordinary skill in the art to optimize the solder reflow performance of the package, depending on the specific application, and selected operational and reliability characteristics.

FIG. 2 illustrates a flow diagram of a suitable method of packaging the die 114 as illustrated in FIG. 1, in accordance with one embodiment of the invention. At 202, the process begins. At process point 204, an IHS lid is provided. The die side of the IHS may have one or more solder reservoirs as illustrated in FIGS. 1a-1d. The die side of the IHS comprises a complementary material suitable for wetting with a solderable TIM. In one embodiment, the complementary material is copper (Cu), in another it may be gold (Ag) or nickel (Ni).

Next, for the embodiments, at 206, the die side of the IHS lid may be chemically cleaned to facilitate bonding with the solderable TIM.

Next, for the embodiments, at 208, at least one metal layer on the IHS side of the die may be formed to serve as an adhesion layer.

Next, for the embodiments, at 210, a fluxless capable solderable TIM layer is deposited on either the die side of the IHS lid or on the metal layer of the die.

Next, for the embodiments, at 212, the die side of the IHS is positioned on the IHS side of the die (or the IHS side of the die is positioned on the die side of the IHS), and a sufficient force can be applied, for example using a spring, to hold the IHS in position during a solder reflow process to bond the IHS and the die into the IHS/die assembly 100 of FIG. 1, according to one embodiment.

Next, for the embodiment, at 214, the IHS/die assembly 100 is put into a suitable heating environment, such as a flow furnace, to reflow the solderable TIM to bond the IHS to the die. For one embodiment, the solderable TIM may be exposed to a gas at a first gaseous pressure while in the furnace. This exposure, for some embodiments, may comprise applying an at least partial vacuum to the flow furnace chamber. In other embodiments, the solderable TIM may be exposed at an approximate ambient pressure for the first gaseous pressure. The gas may be air, or one or more inert gases such as Argon, Nitrogen, Krypton, and Neon. In another embodiment, a reducing gas such as hydrogen may be used. In yet another embodiment, any combination of two or more of the three types of gases maybe used (air, an inert gas, and a reducing gas).

Next, for the embodiments, at 216, for solderable TIM 106 comprising tin/bismuth and/or indium/silver alloys, the bonding operation may be performed at temperatures of approximately 155 degrees Celsius to 170 degrees Celsius. The time above liquidus (TAL) may be from approximately thirty (30) seconds to more than three (3) minutes.

In another embodiment, at 216, for solderable TIM 106 comprising pure indium, and/or indium/silver alloys, the bonding operation may be performed at temperatures of approximately 170 degrees Celsius to 180 degrees Celsius. The time above liquidus (TAL) may be from approximately thirty (30) seconds to more than three (3) minutes.

For other embodiments, other suitable solderable interface materials may be used with complementary temperature and time profiles applied to facilitate bonding.

Next, for the embodiments, at 218, while the solderable TIM is still at a liquidus state, the solderable TIM is exposed to a second gaseous pressure greater than the first gaseous pressure. For various embodiments, another gas may be used/introduced different from the first gas. In other embodiments, the same gas may be used at the various gaseous pressures. The second gaseous pressure may be approximately ambient atmospheric pressure or higher. For yet another embodiment, the pressure difference between the first gaseous pressure and the second gaseous pressure is approximately 300 Torr.

Next, for the embodiments, at 220, the solderable TIM is solidified while at the second gaseous pressure, which is higher than the first gaseous pressure. This may encourage the closing and reduction of voids in the solderable TIM. Solidification may comprise ramping the temperature of the solderable TIM down to ambient room temperature. In various embodiments, the temperature is ramped down at a rate lower than about 100 degrees Celsius per minute. In one embodiment, the ramp down rate is approximately 30 degrees Celsius per minute. Once at room temperature, the spring or claim assembly holding the IHS/die assembly together during the bonding process may be removed.

Figure 4:
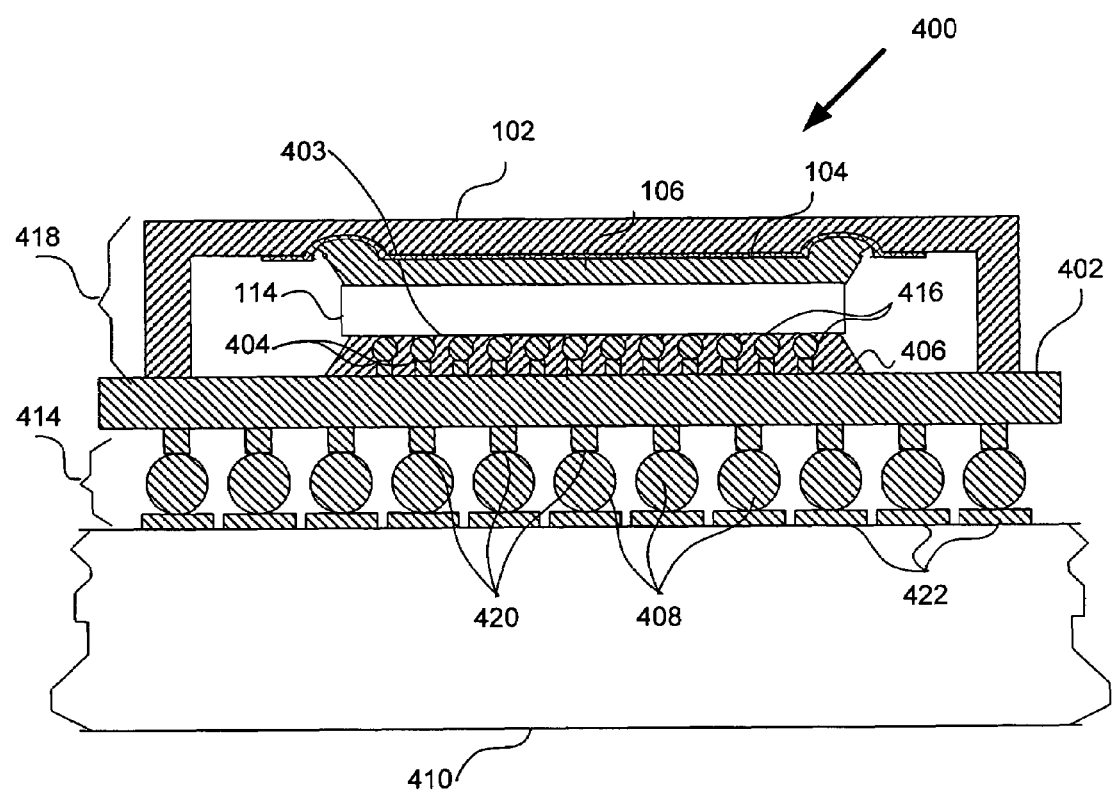
FIG. 4 illustrates a cross-sectional representation of an integrated circuit package, in accordance with one embodiment of the invention.

Next, for the embodiments, at 222, a side of the die opposite that of the IHS 102 of the IHS/die assembly 100 can be placed on substrate 402 (as shown in FIG. 4) and an underfill 406 (as shown in FIG. 4) may be applied to fill the die/substrate gap and then cured. The underfill may comprise an epoxy based compound.

Next, for the embodiments, at 224, through any suitable reflow process, the IHS/Die assembly 100 may be bonded to the substrate.

The operations described above with respect to the methods illustrated in FIG. 2 can be performed in a different order from those described herein in accordance with various embodiments. For example, it will be understood by those of ordinary skill that 208 could be carried out prior to 204 or 206, that 212 may be carried out simultaneously with 222, and 224 may be performed with 218. Additionally, 216 may be performed prior to 214. In another embodiment, the die can be bonded to the substrate first using, for example, the C4 process technology. The IHS can then be subsequently bonded to the die/substrate assembly using appropriately selected operations 204 through 220.

The above-described choice of materials, geometry, number of layers, temperatures, reflow/thermal aging times, deposition, and assembly can all be varied by one of ordinary skill in the art to optimize the thermal performance of the package, depending on the specific application, and selected operational and reliability characteristics.

Any suitable method, or combination of different methods, for depositing the metal layers and TIM can be used, such as sputtering, vapor, electrical, screening, stenciling, chemical including chemical vapor deposition (CVD), vacuum, and so forth.

The particular implementation of the IC package is flexible in terms of the orientation, size, number, and composition of its constituent elements. Various embodiments of the invention can be implemented using various combinations of substrate technology, IHS technology, thermal interface material, and sealant to achieve the advantages of the present disclosure. The structure, including types of materials used, dimensions, layout, geometry, and so forth, of the IC package can be built in a wide variety of embodiments, depending upon the requirements of the electronic assembly of which it forms a part.

For an embodiment, the process may also include the use of complementary materials that form intermetallic compounds between the solderable TIM and either the IHS or the metallization layer on the die.

FIG. 3a-3d illustrate cross-sectional views of various stages of fabrication of packaging a die with an integrated heat spreader to form a die/IHS assembly 100, in accordance with an embodiment of the methods of the present invention.

Figure 3A:
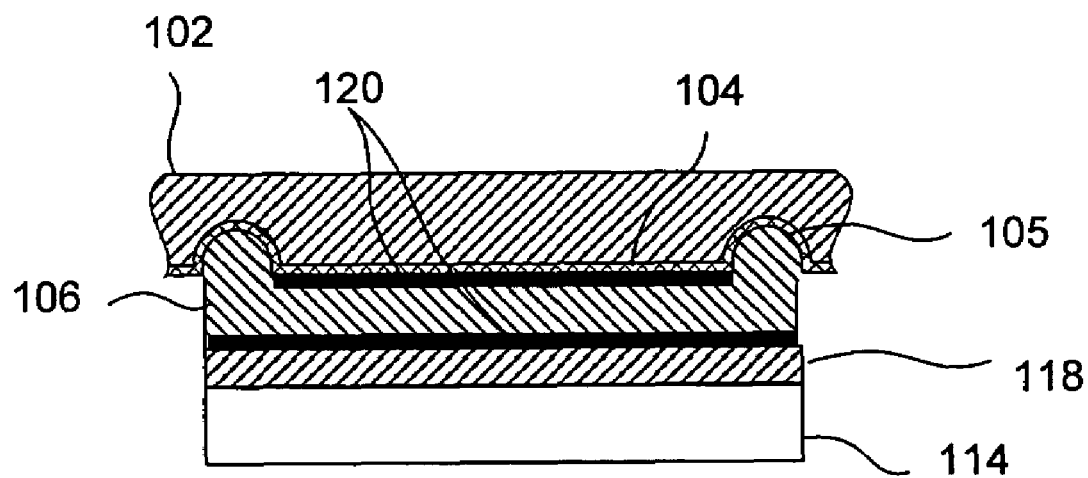
FIG. 3a-3d are cross-sectional views of various stages of fabrication of packaging a die with an integrated heat spreader, in accordance with an embodiment of the methods of the present invention.

FIG. 3a, in accordance with one embodiment, illustrates an integrated heat spreader 102 of FIG. 1a prior to reflow of the solderable TIM 106. Further, for some embodiments, one or more solder reservoirs 105 may be created by forming recesses in an inner region of the die side of the integrated heat spreader 102. For an embodiment, this inner region may correspond to the perimeter of the silicon die 114 in the assembled package. To assist in providing sufficient solderable TIM 106 to fill any voids created during the reflow, additional solderable thermal interface material 106 can be plated, stamped, thermal sprayed, vapor deposited or rolled into the one or more solder reservoirs 105. However, for other embodiments, the voids may be filled/reduced by ensuring sufficient solderable TIM 106 is available in the absence of solder reservoirs 105. Alternately, for yet another embodiment, the voids may be filled/reduced by ensuring sufficient solderable TIM 106 is available in the absence of solder in the solder reservoirs 105. For yet another embodiment, flux 120 may be used on the metallization layer 118 and the die side 104 of the integrated heat spreader 102 to facilitate adhesion and wetting with the solderable TIM 106. However, for another embodiment, the fabrication of the die/IHS 100 assembly may be performed without flux 120.

Figure 3B:
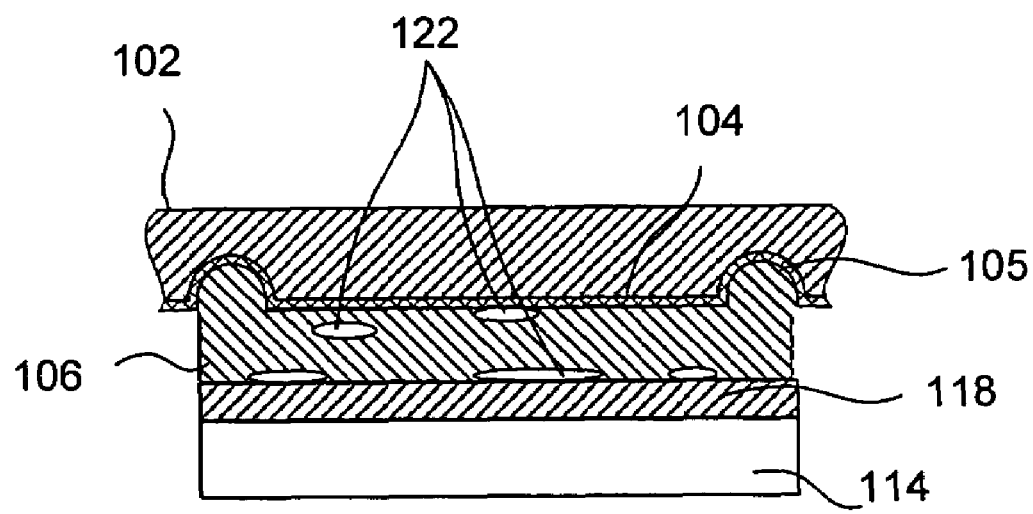
Figure 3C:
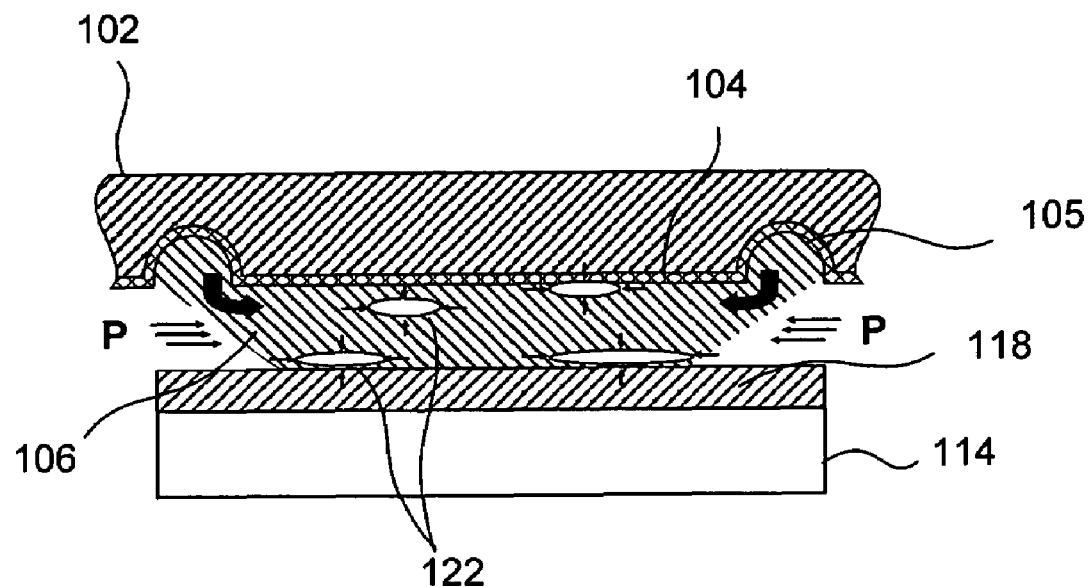
Figure 3D:
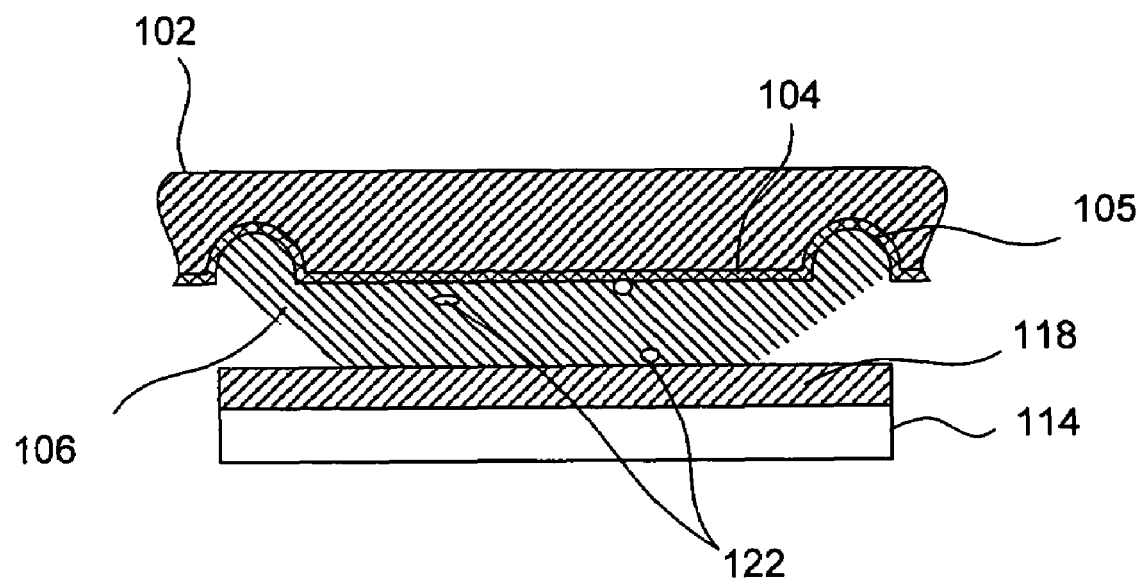

FIG. 3b-3d illustrate in accordance with one embodiment the die 114 and IHS 102 with the solderable TIM 106 after heat has been applied. The solderable TIM 106 has become liquidus. Entrapped air between the die 114 and the IHS 102 as well as gases from flux decomposition can cause voids 122. For some embodiments, as discussed earlier, these voids 122 may be reduced in number and size by application of gases at different pressures during the reflow cycle. For example, for one embodiment the gas surrounding the solderable TIM 106 while at a liquidous state may be reduced for a period of time to below that of ambient pressure to a first pressure. This reduction in pressure may encourage escaping of gases from the voids 122. FIG. 3c illustrates that then later, the pressure may be returned back to ambient pressure (a second pressure), again while the solderable TIM 106 is at the liquidous state. While at the second pressure, the solderable TIM 106 is cooled and solidified. This may have the effect of squeezing any remaining trapped gases thereby reducing the void size through isostatic pressure as illustrated in FIGS. 3c and 3d for one embodiment. In addition, liquid metals may shrink as they solidify. In various embodiments, the applied pressure differential may help feed the solderable TIM 106 into the shrinkage that may otherwise cause porosity. This may help in reducing the size of the pores (voids 122) in the final package.

However, for various embodiments, the first pressure may remain ambient while later a higher than ambient pressure may be applied, or the first pressure might be of less than ambient and the second pressure greater than ambient. The effect may be the same in reducing the void size by application of pressure differences. For another embodiment, the pressure difference between the first pressure and the second pressure is approximately 300 Torr.

FIG. 4 illustrates a cross-sectional representation of an integrated circuit (IC) package 400, in accordance with one embodiment of the invention. The IC package comprises the IHS/die assembly 100 mounted on an organic land grid array (OLGA) substrate 402 and a lid or integrated heat spreader (IHS) 102 of FIG. 1. While an OLGA substrate is shown, as mentioned earlier, embodiments of the present invention are not limited to use with an OLGA substrate and any other type of substrate can be employed. Die 114 can be of any type. In one embodiment, die 114 is a processor. In FIG. 1, die 114 comprises a plurality of signal conductors (not shown) that terminate in pads on a bottom surface 403 (second side) of die 114 (not shown). These pads can be coupled to corresponding lands 404 representing signal, power or ground nodes on OLGA substrate 402 by appropriate connections such as C4 solder bumps 416. A suitable underfill 406, such as an epoxy material, can be used to surround C4 solder bumps 416 to provide mechanical stability and strength. Still referring to FIG. 2, IHS 102 forms a cover over die 114. Prior to mounting the IHS/die assembly 100 to the substrate 402, the IHS 102 is thermally coupled to a surface of die 114 through a suitable solderable thermal interface material 106 (FIG. 1). Die 114 can thus dissipate a heat through the solderable thermal interface material 106 to IHS 102. For one embodiment, IHS 102 has one or more solder reservoirs 105 to provide additional solderable thermal interface material 106 during a bonding/reflow process attaching the IHS 102 to the die 114. In another embodiment, the wall or support member 418 is located at the periphery of IHS 102. However, in other embodiments, IHS 102 can extend beyond the support member 418. For example, a heat spreader of any shape can be formed as part of or attached to IHS 102 in order to increase the rate of heat dissipation from die 114. OLGA substrate 402 can be of any type, including a multi-layer substrate. OLGA substrate 402 can be mounted to an additional substrate 410, such as a printed circuit board (PCB) or card. OLGA substrate 402 can comprise, for example, a plurality of lands 420 that can be mechanically and electrically coupled to corresponding lands 422 of substrate 410 by suitable connectors such as ball grid array (BGA) solder balls 408. While a BGA arrangement 414 is illustrated in FIG. 4 for coupling OLGA substrate 402 to substrate 410, embodiments of the present invention are not limited to use with a BGA arrangement and it can be used with any other type of packaging technology, e.g., land grid array (LGA), chip scale package (CSP), or the like. Further, embodiments of the present invention are not to be construed as limited to use in C4 packages and they can be used with any other type of IC package where the herein-described features of the present subject matter provide an advantage.

Figure 5:
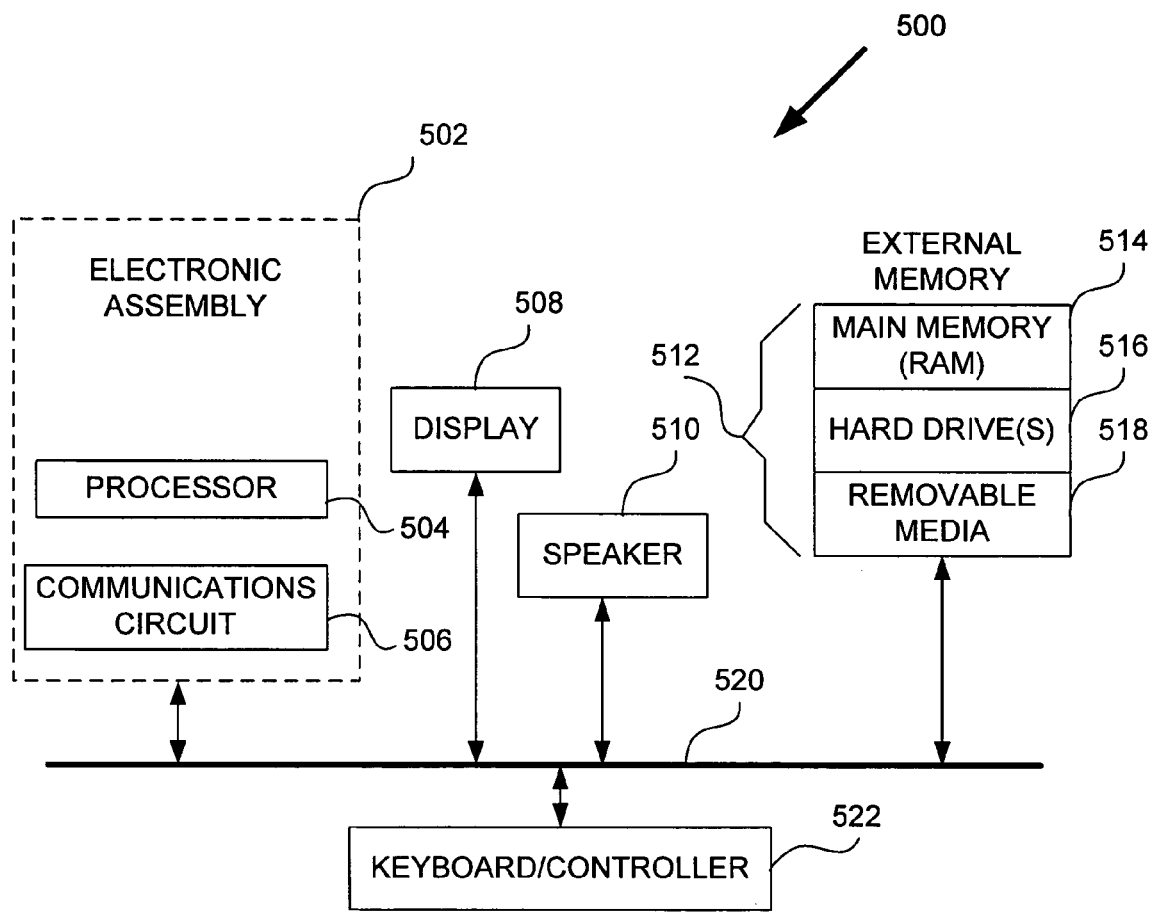
FIG. 5 is a block diagram of an electronic system incorporating at least one electronic assembly with a solderable thermal interface in accordance with one embodiment of the invention.

FIG. 5 illustrates a system 500 incorporating at least one electronic assembly 402 with the IHS/die assembly 100 of FIG. 1 in accordance with one embodiment of the invention. This electronic assembly 502 may have a processor 504 and/or communications circuit 506. The system 500 may further include external memory 512 which in turn can have a main memory 514 in the form of random access memory (RAM), one or more hard drives 516, and/or one or more drives that can use removable media 518, for example, floppy diskettes, compact disks (CDs), digital video disk (DVD), and the like. Additionally, for this example a system bus 520 is used to provide communications links among the various components of the system 500. System bus 520 may be a single bus or a combination of buses. The user interfaces of system 500 may comprise one or more displays 508, one or more speakers 510, and/or a keyboard/controller 522. As earlier stated, one or more of the above-enumerated elements, such as processor 504, may include the IHS/die 100 assembly described above.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the embodiments of the present invention. Therefore, it is manifestly intended that this invention be limited only by the claims.

What is claimed is:

1. An integrated circuit package comprising:
   a semiconductor die having a first side and an opposite second side;
   a metallization layer coupled to the first side;
   an integrated heat spreader having a die side, the die side having disposed therein a first solder reservoir;
   a solderable thermal interface material coupling the die side of the integrated heat spreader to the metallization layer; and
   a substrate having a surface coupled to the semiconductor die second side.

2. The integrated circuit package of claim 1, wherein the first solder reservoir comprises a recession disposed in an inner region of the die side of the integrated heat spreader disposed.

3. The integrated circuit package of claim 1, wherein the integrated heat spreader further comprises a second solder reservoir.

4. A system comprising:
   at least one integrated circuit package having;
      a semiconductor die having a first side and an opposite second side,
      a metallization layer coupled to the first side,
      an integrated heat spreader having a die side, the die side having disposed therein a first solder reservoir;
      a solderable thermal interface material coupling the die side of the integrated heat spreader to the metallization layer; and
      a substrate having a surface coupled to the semiconductor die second side;
   a bus coupled to the at least one integrated circuit package; and
   a disk storage device coupled to the bus.

5. The system of claim 4, wherein the first solder reservoir comprises a recession disposed in an inner region of the die side of the integrated heat spreader.

6. The system of claim 4, wherein the integrated heat spreader comprises a second solder reservoir.

7. The system of claim 4, wherein the system is a device selected from the group consisting of a set-top box, a digital camera, a CD player, a DVD player, a wireless mobile phone, a tablet computing device and a laptop computing device.

* * * * *